United States Patent
Hoeglauer et al.

(10) Patent No.: US 7,667,326 B2
(45) Date of Patent: Feb. 23, 2010

(54) POWER SEMICONDUCTOR COMPONENT, POWER SEMICONDUCTOR DEVICE AS WELL AS METHODS FOR THEIR PRODUCTION

(75) Inventors: Josef Hoeglauer, Munich (DE); Ralf Otremba, Kaufbeuren (DE); Xaver Schloegel, Sachsenskam (DE)

(73) Assignee: Infineon Technologies AG, Munich (DE)

( * ) Notice: Subject to any disclaimer, the term of this patent is extended or adjusted under 35 U.S.C. 154(b) by 222 days.

(21) Appl. No.: 11/736,999

(22) Filed: Apr. 18, 2007

(65) Prior Publication Data

US 2007/0246838 A1    Oct. 25, 2007

(30) Foreign Application Priority Data

Apr. 20, 2006   (DE) .................. 10 2006 018 765

(51) Int. Cl.
*H01L 23/48*    (2006.01)
*H01L 29/40*    (2006.01)

(52) U.S. Cl. .................. 257/762; 257/784; 257/684

(58) Field of Classification Search .................. 257/762, 257/784, 684
See application file for complete search history.

(56) References Cited

U.S. PATENT DOCUMENTS

| | | | |
|---|---|---|---|
| 3,879,746 A | 4/1975 | Fournier | |
| 4,702,967 A | 10/1987 | Black et al. | |
| 4,804,636 A | 2/1989 | Groover, III et al. | |
| 5,637,922 A | 6/1997 | Fillion et al. | |
| 6,140,702 A * | 10/2000 | Efland et al. | 257/762 |
| 6,197,181 B1 | 3/2001 | Chen | |
| 6,335,107 B1 * | 1/2002 | Abys et al. | 428/680 |
| 6,406,937 B1 | 6/2002 | Hedler | |
| 7,190,057 B2 * | 3/2007 | Seki et al. | 257/678 |
| 7,402,457 B2 * | 7/2008 | Hase et al. | 438/106 |
| 2005/0017291 A1 | 1/2005 | Hirler | |
| 2007/0012950 A1 * | 1/2007 | Cain et al. | 257/194 |
| 2007/0228567 A1 * | 10/2007 | Bauer et al. | 257/739 |

FOREIGN PATENT DOCUMENTS

| | | |
|---|---|---|
| DE | 19943385 | 4/2001 |
| DE | 10324751 | 1/2005 |
| DE | 102004047522 | 4/2006 |
| DE | 102006012007 | 9/2006 |
| WO | 0184630 | 11/2001 |
| WO | 03030247 | 4/2003 |
| WO | 2006034680 | 4/2006 |

OTHER PUBLICATIONS

Jiguet, et al., "Conductive SU8 Photoresist for Microfabrication", IN: Advanced Functional Materials, vol. 15, Issue 9, pp. 1511-1516, Abstract, Jul. 2005.

* cited by examiner

*Primary Examiner*—Long Pham
*Assistant Examiner*—Steven H Rao
(74) *Attorney, Agent, or Firm*—Banner & Witcoff, Ltd.

(57) ABSTRACT

A power semiconductor component (2) has a semiconductor body with a front face (7) and a rear face (9). The front face (7) has a front-face metallization (8), which provides at least one first contact pad (11). A structured metal seed layer (14) is provided as the front-face metallization (8), is arranged directly on the semiconductor body, and has a thickness d, where $1\,\text{nm} \leq d \leq 0.5\,\mu\text{m}$.

32 Claims, 4 Drawing Sheets

POWER SEMICONDUCTOR COMPONENT, POWER SEMICONDUCTOR DEVICE AS WELL AS METHODS FOR THEIR PRODUCTION

RELATED APPLICATION

This application claims priority from German Patent Application No. 10 2006 018 765.2, which was filed on Apr. 20, 2006, and is incorporated herein by reference in its entirety.

TECHNICAL FIELD

The invention relates to a power semiconductor component having front-face metallization, and to a power semiconductor device having a power semiconductor component, and to methods for their production.

BACKGROUND

Various approaches are being adopted in order to improve the power of power semiconductor devices which, for example, have power MOSFETs or IGBTs as semiconductor components. The inner contact elements of the device, for example the bonding wires and/or contact clips, can be optimized by the selection and strength of the material. The diameter of the bonding wires, for example, may be increased in order to reduce losses. However, this approach has the disadvantage that it increases the costs of the device, since on the one hand more material is used, and on the other hand new technologies, for example contact clips, must be developed.

It is known from DE 103 24 751 for the power of the semiconductor component to be improved by reducing the semiconductor component thickness. This is done by applying a stabilization layer to the front face of the semiconductor component, in order to mechanically support the semiconductor component while it is being ground down. However, this method is complex to carry out, and is in consequence expensive.

SUMMARY

According to an embodiment, a power semiconductor component may comprise a semiconductor body with a front face and a rear face, the front face having a structured metal seed layer as a front-face metallization which provides at least one first contact pad, wherein the structured metal seed layer is arranged directly on the semiconductor body and has a thickness d where $1\ nm \leq d \leq 0.5\ \mu m$.

BRIEF DESCRIPTION OF THE DRAWINGS

The invention will now be explained in more detail with reference to the attached figures.

DETAILED DESCRIPTION

Figure 1:
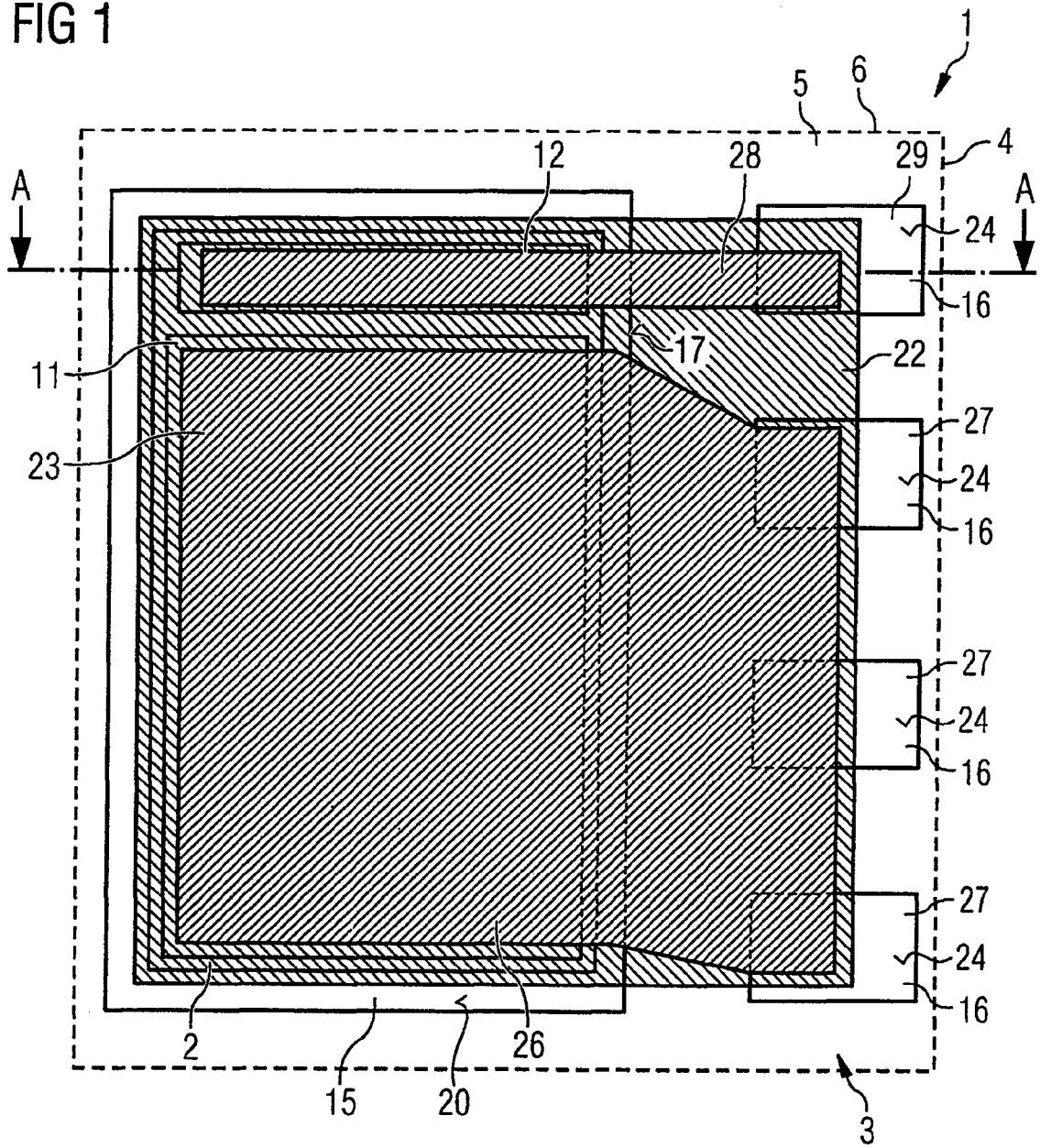
FIG. 1 shows a schematic plan view of a power semiconductor device according to a first embodiment.

A power semiconductor component can be produced at low cost and may have good performance.

According to an embodiment, a power semiconductor component may have a semiconductor body with a front face and a rear face. The front face of the semiconductor body has front-face metallization which provides at least one first contact pad. A structured metal seed layer is provided as the front-face metallization, is arranged directly on the semiconductor body and has a thickness d, where $1\ nm \leq d \leq 0.5\ \mu m$.

The metal seed layer differs from known front-face metallization by its thickness and its electrical conductivity. One known front-face metallization provides an electrical contact. In consequence, this layer has a low resistance and has a thickness of at least 1 μm to 5 μm. In contrast to this, the metal seed layer according to an embodiment has a reduced thickness of 1 nm up to 0.5 μm, and provides a high-resistance layer which, in its own right, is not suitable as an electrically conductive contact.

The metal seed layer according to an embodiment therefore provides an initial-stage layer which can be used during the assembly of a device in order to allow a desired metallization structure and a desired contact to be applied to the metal seed layer. The power semiconductor component according to an embodiment, with its metal seed layer as the front-face metallization, is therefore flexible and can be used in a number of types of devices.

The production costs of the device are therefore reduced, since there is no need to produce a specific semiconductor component, for example with front-face metallization of a specific thickness for a specific application. The semiconductor device according to an embodiment can thus be used for devices in which metallization with a thickness of 10 μm and metallization with a thickness of 100 μm is desired, since a further metal layer of the desired thickness can be applied to the metal seed layer. The metal seed layer according to an embodiment separates the production of the semiconductor body with its integrated circuits and transistor cells from the production of the electrically conductive front-face metallization, and from the construction of the device in a housing.

The metal seed layer according to an embodiment makes it possible to produce a further contact layer or a connecting layer directly on the metal seed layer while the component is being assembled to produce a device. The electrically conductive contacts of the front-face metallization are therefore not produced during the wafer production process, but only while the devices are being assembled. This allows greater flexibility for the device manufacturer, since the desired contact can be applied directly to the metal seed layer by low-cost processes. This allows greater flexibility for the design of the front-face metallization and the construction of a device, in particular of a packaged device.

The metal seed layer may have a thickness d of $1\ nm \leq d \leq 200\ nm$, preferably $10\ nm \leq d \leq 100\ nm$. The thinner the layer, the less is the cost for production of the power semiconductor component, since the material costs and the production time are reduced. In one embodiment, the metal seed layer has chromium, nickel, palladium or titanium. These elements adhere well to silicon, and thus provide a reliable layer. In a further embodiment, the metal seed layer is free of aluminum.

In one embodiment, the power semiconductor component is a vertical power semiconductor component. The structured metal seed layer provides at least one control contact pad in addition to a first contact pad. The rear face of the semiconductor component has at least one second contact pad. The first contact pad may provide a source contact pad, the control contact pad may provide a gate contact pad, and the second contact pad may provide a drain contact pad. The control contact pad may be provided in the form of a strip, which may extend over the width of the front face.

In one alternative embodiment, the power semiconductor component is a lateral power semiconductor component. As the front-face metallization, the structured metal layer therefore provides at least one control contact pad, one second contact pad and one first contact pad.

The power semiconductor component may be a MOSFET (Metal Oxide Semiconductor Field Effect Transistor) or a BJT (Bipolar Junction Transistor) or an IGBT (Insulated Gate Bipolar Transistor). The power semiconductor component may be a diode, with the anode and/or the cathode having a metal seed layer as the anode and/or cathode.

The power semiconductor component may be produced, together with its metal seed layer as the front-face metallization, in the form of a wafer. The semiconductor wafer has a plurality of component positions arranged in rows and columns, which each provide a power semiconductor component according to one of the embodiments as described above.

Once the metal seed layer has been produced at each of the device positions, the wafer can be split in order to provide a plurality of semiconductor components. The semiconductor components together with their metal seed layer can then be used in various forms of devices. A further contact layer and/or further connecting elements may be applied to the metal seed layer.

In a further embodiment, the front-face metallization furthermore has a contact layer, which is arranged on a metal seed layer according to one of the exemplary embodiments described above. The contact layer consists of one or more electrochemically applied metals. The overall thickness of the contact layer and of the metal seed layer can be adjusted as required, and may have an overall thickness of more than 10 µm to 100 µm, or even 500 µm. In one embodiment, the contact layer has a thickness a, where $10\ \mu m \leq a \leq 500\ \mu m$, preferably $10\ \mu m \leq a \leq 100\ \mu m$.

The contact layer may consist essentially of copper, nickel or an alloy of one of these elements, and may be free of aluminum. This two-layer arrangement of the front-face metallization also leads to an improvement in the reliability of the device, since the entire front-face metallization, and in consequence each cell of the semiconductor component, is covered with a thick contact layer.

Since the contact layer is applied by means of an electrochemical process, the contact layer can be produced at low cost in comparison to vacuum processes such as sputtering or vapor deposition. The metal seed layer may be provided as a structured layer on the front face of the semiconductor body, so that any desired number and arrangement of contact pads can be provided. The contact layer can be applied selectively to the structured metal seed layer by electrodeposition and, in particular, by electroless deposition. The contact layer may also be applied to a plurality of components at wafer level, and to a single component.

A power semiconductor device may have at least one power semiconductor component according to one of the embodiments as described above. The power semiconductor device may have a known package type.

In one embodiment, an electrochemically deposited structured contact layer is arranged on the metal seed layer. The contact pad or the contact pads of the metal seed layer on the front face of the semiconductor body are electrically connected to contact connections of the device via the contact layer, by means of bonding wires and/or contact clips.

In one embodiment, the power semiconductor device has a power semiconductor component with a metal seed layer according to one of the embodiments, and a leadframe. The leadframe has a plurality of contact connections and a chip carrier. The contact connections each have an inner contact pad and an outer contact pad. The rear face of the semiconductor component is mounted on the chip carrier.

The power semiconductor device furthermore has an isolation film with an upper face and a lower face, which is arranged on the front face of the semiconductor component. The isolation layer extends from the front face of the semiconductor component to the upper face of at least one contact connection, and bridges a distance between the chip carrier and the contact connection. An electrically conductive connecting layer is arranged on the upper face of the isolation film, and electrically connects at least one first contact pad on the front-face metallization to at least one contact connection.

The isolation film and the connecting layer arranged on it provides a planar interposing structure, which electrically connects the contact pads on the front face of the power semiconductor component to the leadframe. The isolation film may be arranged in an interlocking form on the semiconductor component. This power semiconductor device has the advantage that the height of the device is reduced.

The isolation film is electrically insulating and may comprise of polyimide, polyethylene, polyphenyl, polyetheretherketone, epoxy resin, a thermoplastic or a thermosetting plastic. In one embodiment, the isolation film has at least one through-opening, which exposes at least one area of the first contact pad. The through-opening thus extends through the entire thickness of the film.

One area of the connecting layer is arranged in the through-opening and can fill the through-opening, or can at least cover the walls of the film, in order to provide an electrical connection between the contact pad and the contact connections of the leadframe. The connecting layer is arranged directly on that area of the metal seed layer which is free of the isolation film through the through-opening.

In a further embodiment, the isolation film has at least one through-opening, which exposes at least one area of the inner contact pad of the contact connection. The connecting layer thus extends from the contact pad of the semiconductor component to the exposed area of the contact connection. One area of the connecting layer is arranged in this through-opening and directly on the upper face of the contact connection, and is electrically connected to the contact connection.

The connecting layer may be a layer produced by means of sputtering or vapor deposition. In a further embodiment, the connecting layer is a multiple layer. A lowermost layer of the connecting layer may be an adhesion-promoting layer, and an uppermost layer of the connecting layer may be a low-resistance layer. This arrangement has the advantage that the reliability of the connecting layer is improved by the adhesion-promoting layer, while at the same time improving the characteristics of the device, since the uppermost layer is a low-resistance layer.

The lowermost layer may be a layer which is produced by sputtering or vapor deposition, and the uppermost layer may be an electrochemically applied layer. The lowermost layer may have a thickness of less than 1 µm, and also provides a seed layer on which a second layer can be applied electrochemically. The uppermost layer is thicker than the lowermost layer, and may have a thickness of 5 µm to 500 µm. This multilayer layer arrangement has the advantage that the lowermost layer can easily be deposited directly on the electrically insulating film. The uppermost layer can then be applied to the lower layer by means of a lower-cost electrochemical process.

In one embodiment, the connecting layer consists essentially of copper or nickel, or of an alloy thereof. These metals have the advantage that they are highly electrically conductive and can be deposited easily and reliably by means of electrodeposition., If a multiple layer is provided as the connecting layer, the lowermost layer and/or the uppermost layer of the connecting layer may consist essentially of copper or nickel, or of an alloy thereof. In this embodiment, the metal seed layer provides an adhesion layer and diffusion barrier, so that copper can be applied directly as the connecting layer on the metal seed layer, as well as the isolation film.

The connecting layer may be free of aluminum and, in one embodiment, has a thickness b where $10 \ \mu m \leq b \leq 500 \ \mu m$, preferably $10 \ \mu m \leq b \leq 100 \ \mu m$.

In the embodiment, the connecting layer has a plurality of areas which are electrically isolated from one another. Each area can provide the contact for one type of contact pad on the front face of the semiconductor component. If, for example, the semiconductor component is a vertical power transistor, the front face has a load contact pad and a control contact pad. The connecting layer accordingly has two electrically isolated areas.

In one embodiment, the connecting layer has at least two connecting areas, which are electrically isolated from one another and each electrically connect one contact pad on the front-face metallization to at least one contact connection of the leadframe. Each connecting area therefore extends from a contact pad of the semiconductor component to at least one contact connection.

The isolation film and the connecting layer applied to it provide a planar interposing structure, which can easily be matched to different arrangements of the contact pad on the front-face metallization. This planar interposer can advantageously be used for a power semiconductor component with a control strip.

In one embodiment, at least one control contact pad in the form of a strip is arranged on the front face of the power semiconductor component. The entire length of the control contact pad, which is in the form of a strip, is electrically connected via an area of the connecting layer to at least one contact connection of the leadframe.

The control strip can therefore be formed over the entire chip width, and contact can be made with the entire length of the strip, and with the cells located underneath it, via an area of the connecting layer applied thereto. The circuit characteristics of the device are improved in this way.

The power semiconductor device may also have a plastic packaging compound, which sheaths the semiconductor component as well as the isolation film and the connecting layer. The plastic packaging compound and the leadframe may provide a device package corresponding to a known type, such as a TO-220-, TO-252-, a PowerSO-, P-TDSON- or a P-VQFN- package, or a modification of these package types.

The semiconductor component may have front-face metallization which has a metal seed layer and a contact layer applied to it. The power semiconductor component may be electrically connected to the leadframe via bonding wires or one or more contact clips. Alternatively, a planar interposer can be provided, which has an isolation film and connecting layer.

According to embodiments of methods for production of front-face metallization on a power semiconductor component, first of all, a power semiconductor component is provided which has a semiconductor body with a front face and a rear face. A metal seed layer is applied to the body of the semiconductor component, in order to form at least one contact pad. The metal seed layer is deposited with a thickness d, where $1 \ nm \leq d \leq 0.5 \ \mu m$, on the front face of the semiconductor bodies.

In further embodiments, the metal seed layer is deposited with a thickness of $1 \ nm \leq d \leq 200 \ nm$, preferably $10 \ nm \leq d \leq 100 \ nm$. The metal seed layer can be deposited by means of sputtering or vapor deposition.

In one embodiment, at least one first contact pad is formed by deposition of a closed metal seed layer, which is then structured. In an alternative embodiment, the metal seed layer is deposited selectively on the front face of the body of the power semiconductor component, in order to form at least one first contact pad.

In one embodiment, a photosensitive lacquer layer, containing metal, is applied to the front face in order to apply the metal seed layer. The photosensitive lacquer containing metal may be an organic electrically non-conductive layer which has a metal complex or complexes containing metal. The layer is irradiated after the application of the layer, in order to produce metal seeds. This method has the advantage that the layer is not applied by means of a vacuum method, and in consequence can be produced at low cost. The photosensitive lacquer layer containing metal can be applied to the front face by printing, spraying or spin-coating.

In order to form the metal seeds in the lacquer layer, the photosensitive lacquer layer containing metal can be irradiated by means of a UV laser, an excimer laser or a UV emitter. In one embodiment, the photosensitive lacquer layer containing metal is selectively irradiated in order to form separate contact pads, which are electrically isolated from one another. The photosensitive lacquer layer containing metal is thus irradiated selectively over its area, in order to produce the desired arrangement of electrically conductive areas, which provide the contact pads.

In a further step, a contact layer can be electrochemically applied to the metal seed layer in order to form at least one contact. The contact layer may be applied by means of electroless deposition. The contact layer is deposited with a thickness a, where $10 \ \mu m \leq a \leq 500 \ \mu m$, preferably $10 \ \mu m \leq a \leq 100 \ \mu m$.

The metal seed layer can advantageously be applied to a wafer, with the wafer having a plurality of semiconductor components. In one embodiment, the contact layer is also produced at the wafer level, so that the power semiconductor component is separated from the wafer after the deposition of the metal seed layer and of the contact layer.

Alternatively, the wafer can be separated after the deposition of the metal seed layer, in order to provide a plurality of semiconductor components having a front face with a metal seed layer as the front-face metallization. If a further contact layer or a contact element is desired, this layer is can be applied to the separated semiconductor component. This can also be done by mounting the semiconductor component on a chip carrier.

According to an embodiment of a method for production of a power semiconductor device having at least one power semiconductor component according to one of the embodiments described above, a power semiconductor component and a leadframe are provided. The leadframe has a plurality of contact connections and a chip carrier, with the contact connections each having an inner contact pad and an outer contact pad. An isolation film is also provided, and has an upper face and a lower face.

The rear face of the power semiconductor component is mounted on an upper face of the chip carrier for the leadframe. An isolation film is then applied to the upper face of the semiconductor component, exposing at least one first contact pad, and partially exposing the upper faces of the contact connections. The isolation film is arranged such that it extends from the front face to an upper face of at least one contact connection, and bridges a distance between the chip carrier and the contact connection.

An electrically conductive connecting layer is applied on an upper face of the isolation film, such that the connecting layer extends between the first contact pad and the surface of the contact connection.

The connecting layer is therefore applied to the metal seed layer, which is provided as front-face metallization, in order to produce an electrical contact with the cells of the semiconductor component. This method has the advantage that less material is used for the front-face metallization, since the connecting layer is applied directly to the thin metal seed layer. In consequence, the connecting layer can be selected during assembly of the device such that the material costs are reduced. After application of the connecting layer, thicker front-face metallization has little influence on the characteristics of the electrical connection. In consequence, the metal seed layer according to an embodiment avoids higher costs for thicker front-face metallization without detracting from the electrical characteristics of the device.

The power semiconductor component can be soldered to the chip carrier, or can be mounted on the chip carrier by means of a thermally or electrically conductive adhesive. If the power semiconductor component is a vertical component, the rear face of the component is mounted on the chip carrier via an electrically conductive material such that the contact pad on the rear face of the power semiconductor component is electrically connected to the chip carrier. If the power component is a lateral component, then the component can be mounted on the chip carrier via a thermally conductive, electrically insulating material.

In one embodiment, through-openings are produced in the isolation film, before application, in order to expose the first contact pad and in order to partially expose the upper faces of the contact connections. The isolation film can be stamped before application, in order to produce the through-openings. Alternatively, the isolation film can be structured after application. The isolation film may, for example, be structured by means of laser ablation after application.

In one embodiment, the connecting layer is applied layer-by-layer. The various layers can be applied by means of different methods. A first layer of the connecting layer can be deposited by sputtering methods, and a second layer of the connecting layer can be deposited by an electrochemical method. An adhesion-promoting and/or a diffusion-constraining electrically conductive layer may be applied within the first layer or as the first layer.

In a further method step, the components which have been assembled so far can be embedded in a plastic packaging compound, with the outer contacts projecting out of the plastic packaging compound. The power semiconductor component, the upper face of the isolation film and the connecting layer as well as the lower face of the isolation film, which bridges the distance between the contact connections and between the chip carrier and the contact connections of the lead frame, are embedded in the plastic packaging compound.

In summary, a semiconductor component can be specified having a metal seed layer as the front-face metallization. This metal seed layer allows the production of a further contact layer or of a connecting layer directly on the metal seed layer while the component is being assembled in a device.

The metal seed layer according to an embodiment separates the production of the semiconductor body, with its integrated circuits and transistor cells, from the production of the electrically conductive front-face metallization, and from the assembly of the device in a package. The electrically conductive contents for the front-face metallization are therefore not produced during the wafer production process, but only during device assembly. This allows greater flexibility for the device manufacturer, since the desired contact can be applied directly to the metal seed layer by low-cost methods.

FIG. 1 shows a schematic plan view of a power semiconductor device 1 according to a first embodiment. This power semiconductor device 1 has a vertical power transistor 2 as a semiconductor component, a leadframe 3 and a plastic package 4 comprises plastic packaging compound 5. The plastic packaging compound 5 has been omitted from this plan view in order to illustrate the components which are embedded in the plastic packaging compound 5, and only the external contour of the plastic package 4 is illustrated, by means of a dashed line 6.

The semiconductor component 2 is a vertical MOSFET component and has an upper face 7 with front-face metallization 8, and a rear face 9 with rear-face metallization 10. The arrangement of the semiconductor component 2 can be seen in FIG. 2, which shows a cross section along the line A-A in FIG. 1.

The upper face 7 of the power component 2 has a large-area source contact pad 11 and a gate contact pad 12. The gate contact pad 12 is in the form of a strip, and extends over the width of the upper face 7. A drain contact pad 13 is arranged on the rear face 9 of the power semiconductor component 2.

The front-face metallization 8 therefore provides a source contact pad 11 and a gate contact pad 12, in the form of a strip. According to an embodiment, the front-face metallization 8 is a thin metal seed layer 14. The metal seed layer 14 has a thickness of 100 nm, and consists essentially of titanium. Titanium provides good adhesion, and thus a reliable connection to the silicon of the power semiconductor component 2.

The metal seed layer 14 according to an embodiment differs from known front-face metallization structures by being thin and by the electrical conductivity of the layer. The metal seed layer 14 has a high resistance, because it is thin.

The leadframe 3 has a chip carrier 15 and a plurality of contact connections 16 which, in this embodiment, are arranged alongside an edge face 17 of the chip carrier 15, so that there is a distance between the edge face 17 of the chip carrier 15 and the contact connections 16.

The rear face 9 of the power semiconductor component 2 is mounted via a soft-solder layer 19 on the upper face 20 of the chip carrier 15. The drain contact pad 13 is thus electrically connected to the chip carrier 15 via this soft-solder layer 19.

The upper faces 24 of the contact connections 16 provide inner contact pads, and are arranged to be coplanar with the upper face 20 of the chip carrier 15 on a packaging plane. The lower faces 31 of the contact connections 16 project beyond the lower face 32 of the plastic package 4, and provide the outer contact pads of the power semiconductor device 1.

The source contact pad 11 and the gate contact pad 12, which are arranged on the upper face 7 of the power semiconductor component 2, are electrically connected via a planar interposing structure 21 to the contact connections 16 of the leadframe 3. The planar interposing structure 21 has an isolation film 22 and a connecting layer 23. The flat arrangement of the isolation film 22, as well as the connecting layer 23, can be seen in the plan view in FIG. 1.

The isolation film 22 is arranged directly on the upper face 7 of the semiconductor component 2 and is used as an isolation layer for the planar interposing structure 21. The isolation film 22 extends flat over the majority of the upper face 7 of the power semiconductor component 2, while, at the same time, it projects beyond the edge 17 of the power semiconductor component 2, and extends as far as the upper face 24 of the contact connections 16. The isolation film 22 also covers the trenches 30 between the contact connections 16. The isolation film 22 has a plurality of through-openings 18, which are arranged above the source contact pad 11, the gate contact pad 12 and the upper face 24 of the contact connections, and which each expose the upper face of an area of the source contact pad 11, of the gate contact pad 12 and the gate connections 16.

The connecting layer 23 is arranged on the upper face 25 of the isolation film 22 and has two separate areas 26, 27, which are not electrically connected to one another. The connecting layer 23 consists essentially of copper, and has a thickness of approximately 30 μm.

A first area 26 of the connecting layer 23 extends from the source contact pad 11 of the power semiconductor component 2 to the upper face 24 of three contact connections 16 which are arranged alongside one another. These three contact connections 16 are thus the source contact connections 27 of the power semiconductor device 1. The first area 26 of the connecting layer 23 connects the source contact pad 11 to the source contact connections 27. Parts of the first area 26 are thus arranged in the through-openings 18 of the isolation film 22, which expose the source contact pad 12 as well as the upper face 24 of the source contact connections 27. A part of the first area 26 is arranged directly on the metal seed layer 14 and on the upper face 24 of the source contact connections 27.

A second area 28 of the connecting layer 23 connects the gate contact pad 12 on the upper face 7 of the power semiconductor component 2 to the upper face 24 of a gate contact connection 29. Parts of the second area 28 are thus arranged in the through-openings 18 of the isolation film 22, which expose the gate contact pad 12 as well as the upper face 24 of the gate contact connection 29. A part of the second area 28 is arranged directly on the metal seed layer 14 and on the upper face 24 of the gate contact connection 29.

The connecting layer 23 is thus applied directly to the metal seed layer 14 of the front-face metallization 8 and is electrically connected to it. This avoids thicker front-face metallization, thus reducing the material costs as well as the production costs of the power semiconductor component.

The electrically conductive connecting areas 26, 28 can either be applied structured by means of a mask or can be applied over a large area, after which they are structured by means of a photolithographic process, followed by an etching process.

Figure 2:
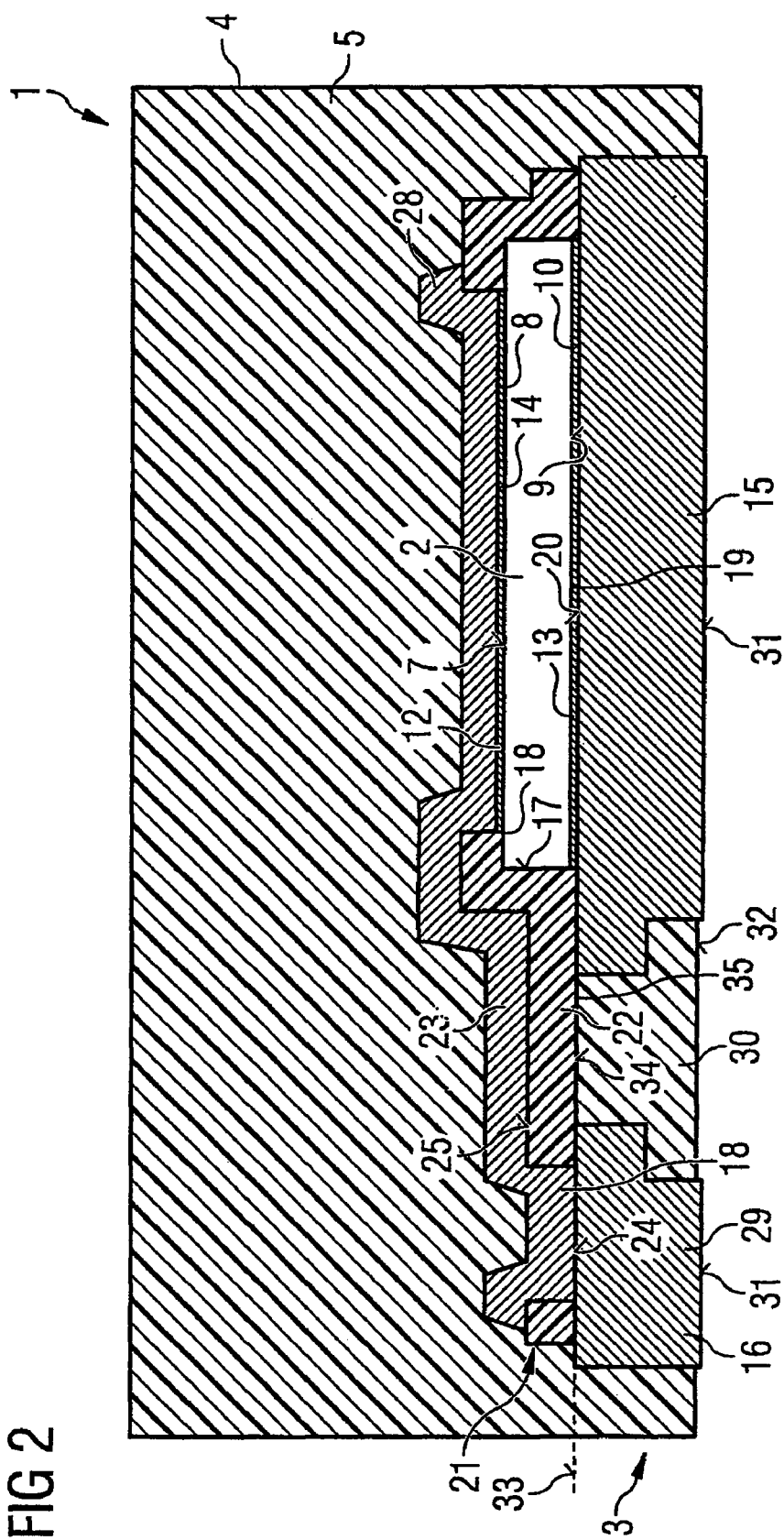
FIG. 2 shows a schematic cross section through the power semiconductor module as shown in FIG. 1, along the section line A-A.

FIG. 2 shows a schematic cross section through the power semiconductor device 1 shown in FIG. 1, along the section plane A-A. Components with the same functions as in FIG. 1 are identified by the same reference symbols, and will not be explained again. As this cross section in FIG. 2 shows, the power semiconductor device 1 is formed on a leadframe 3. The lower faces 31 of the contact connections 16 project out of the lower face 32 of the plastic package 4, or are at least free of any plastic packaging compound 5.

The cross section of the chip carrier 15 and of the gate contact connection 29, with its outer contact pads 31, can be seen in this cross-sectional plane, based on the section plane A-A in FIG. 1. The upper face 10 of the chip carrier 15 as well as the upper face 24 of the gate contact connection 29 are arranged to be coplanar on an inner package plane, whose position is indicated by the dashed line 33. The power semiconductor component 2 is fixed on the upper face 10 of the chip carrier 15 by its rear face 8, which has a drain contact pad 13.

An isolation film 22, which is dimensionally stable at room temperature, is laminated onto the upper face 7 of the power semiconductor component 2, in the edge areas. The isolation film 22 is comprises a thermoplastic material and is pressed onto the substrate and is heated during the lamination process, so that it fuses onto the edge faces of the power semiconductor component 2 and, after cooling down, forms a stable bridge 35 over the trenches 30 between the contact connections 16 at room temperature. The isolation film 22 thus extends over the trenches 30 between the contact connections 16 and over the trenches 30 between the chip carrier 15 and the power semiconductor component 2. The lower face 34 of the areas of the isolation film 22 which bridge these gaps are embedded in the plastic compound 5.

A continuous source connecting layer 26 and gate connecting layer 28 can be deposited on this isolation film 22, respectively electrically connecting the source contact pads 12 and the gate contact pad 13 on the upper face 7 of the power semiconductor component 2 over a large area to the upper faces 24 of the contact connections 16 of the leadframe 3.

The production of this connecting layer 23, which extends from the upper face 7 of the power semiconductor component 2 to the upper face 24 of the contact connections 16, can be applied by deposition of one layer, as a low-resistance electroconnecting layer 21. In this first embodiment, a metal layer is applied both on the upper face 7 of the power semiconductor component 2 and on the upper face 25 of the isolation film 22, in order to deposit a low-resistance layer of sufficient thickness comprising copper or of a copper alloy. The deposition process can be continued until a low-resistance electrical connection is achieved between the contact pads 11, 12 and/or the metal seed layer 14 on the upper face 7 of the power semiconductor component 2 and the upper faces 24 of the contact connections 16.

During the final process of embedding these components of the power semiconductor device 1 in a plastic packaging compound 5, the trenches 30 between the contact connections 16 and between the chip carrier 15 of the contact connections 16 are also filled with plastic packaging compound 5, so that the bridge 35 which is formed from the isolation film 22 for corresponding metallic connecting layers 23 is supported.

In contrast to a connection technique using bonding wires, no distortion of bonding wires, and therefore no inadvertent short circuits, can occur during the process of embedding the components of the power semiconductor device 1. Furthermore, the isolation film 22, which is laminated onto the surface contour of the power semiconductor component 2 and onto the inner packaging plane 33, allows a large-area, thick interposing structure 21 to be applied within the plastic packaging compound 5.

The planar interposing structure 21 comprising an isolation film 22 and connecting areas 26, 28 applied to it can provide a direct electrical connection to the majority of the area of the contact pad 11, 12 of the front-face metallization 8. In the case of the gate contact pad 12, which is in the form of a strip, this leads to the advantage that the switching power of the device 1 is increased in this way.

Figure 3:
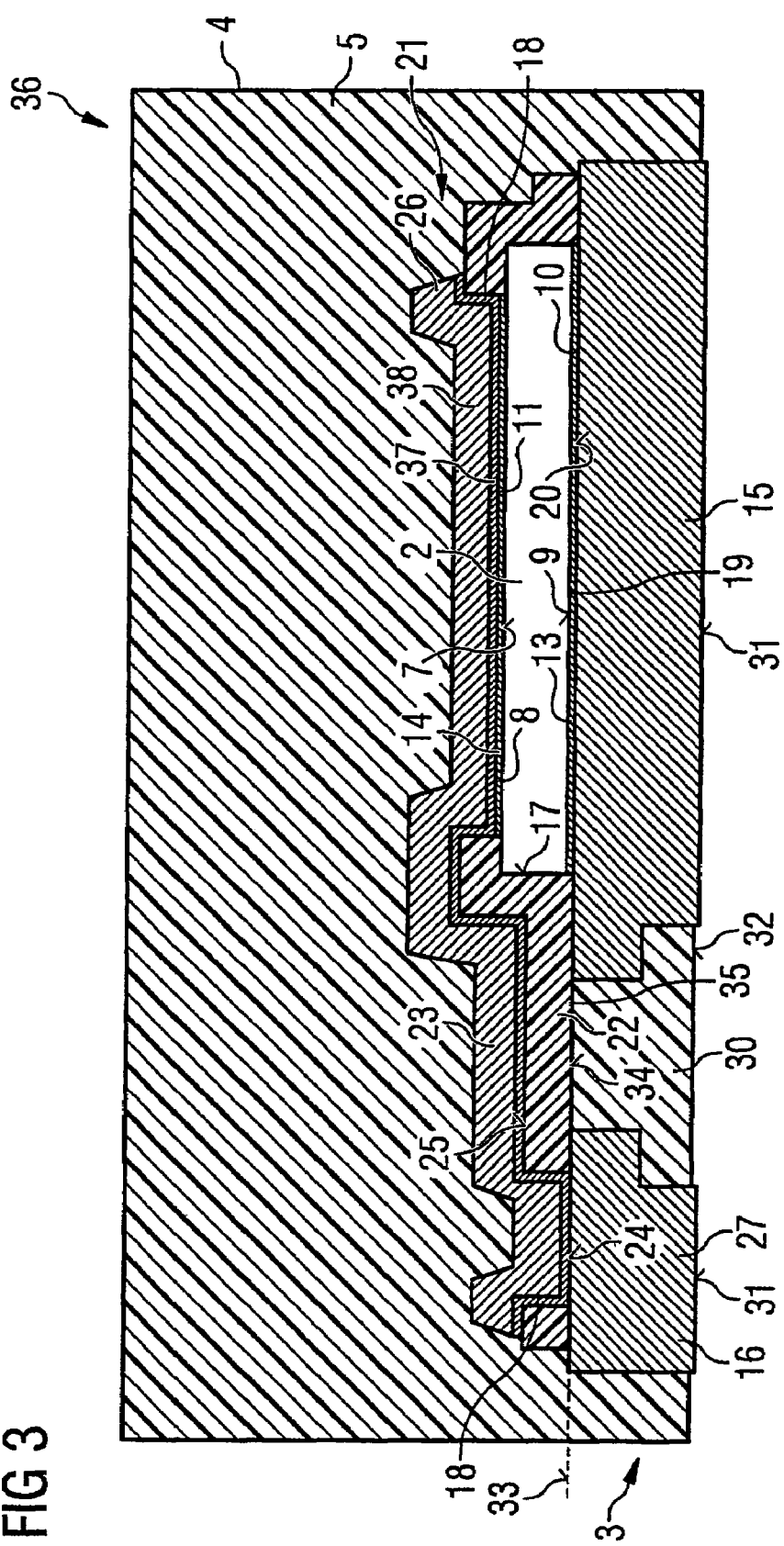
FIG. 3 shows a schematic cross section through a power semiconductor device according to a second embodiment.

FIG. 3 shows a schematic cross section through a power semiconductor device 36 according to a second embodiment. The second power semiconductor device 36 differs from the first power semiconductor device 1 shown in FIGS. 1 and 2 in the arrangement of the connecting layer 23.

In the second embodiment, the connecting layer 23 has two layers 37 and 38 the first layer 37 is arranged directly on the isolation film 22 and the metal seed layer 14, which provides the source contact pad 11 as well as the gate contact pad 13, that is not shown here. The first layer 37 is an adhesion-promoter layer, and is deposited by means of sputtering. The first layer 37 comprises copper, and has a thickness of 0.5 μm.

The second layer 38 of the connecting layer 23 is applied by means of electrodeposition onto the first layer 37, and forms a low-resistance electrical connection between the source contact pad 12 and the source contact connections 27, and between the gate contact pad 13 and the gate contact connection 29. The second layer 38 is therefore arranged on the power semiconductor component 2, as well as the isolation film 22 and the contact connections 16. The second layer 38 comprises copper and has a thickness of approximately 25 μm, and provides a low-resistance interposing layer.

Figure 4:
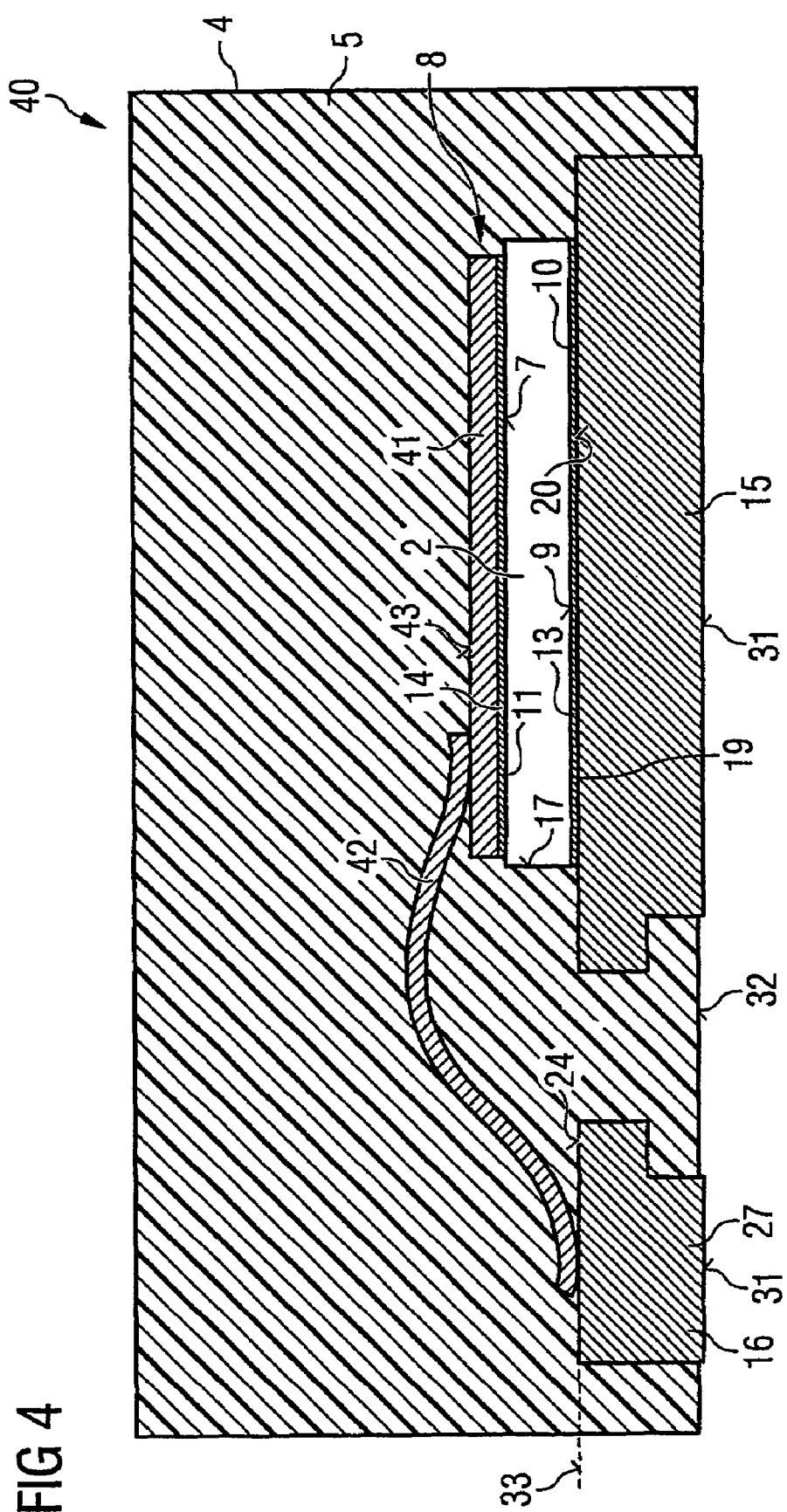
FIG. 4 shows a schematic cross section through a power semiconductor device according to a third embodiment.

FIG. 4 shows a power semiconductor device 40 according to a third embodiment. This power semiconductor device 40 differs from the devices in the first 1 and second 36 embodiments in the arrangement of the front-face metallization 8 and the contact-making method.

In the case of the third power semiconductor device 40, the front-face metallization 8, which provides the source contact pad 11 and the gate contact pad 13, has two layers. The first layer 14 is arranged directly on the upper face 7 of the power semiconductor component 2 and is a metal seed layer 14. The metal seed layer 14 consists essentially of titanium and has a thickness of 200 nanometers. The metal seed layer 14 was applied by means of selective sputtering on the upper face 7 of the power semiconductor component 2. A second layer 41 of the front-face metallization 8 is arranged directly on the metal seed layer 14. The second layer 41 provides a contact layer. The second layer 41 consists essentially of copper, and has a thickness of 50 μm. The second layer 41 was deposited by means of selective electrodeposition onto the metal seed layer 14, and provides a low-resistance layer with high electrical conductivity. The semiconductor component 2 was separated from a wafer after production of the front-face metallization 8 with the two layers 14, 41 and after the production of the rear-face metallization 10.

The rear face 9 of the semiconductor component 2 is arranged on the upper face 20 of the chip carrier 15, and is electrically connected to it via a soft-solder layer 19. The source contact pad 11 is then electrically connected to the source contact connections 27 via bonding wires 42. The bonding wires 42 comprise aluminum and have a diameter of 150 μm. The bonding wires 42 extend between the upper face 43 of the contact layer 41 of the front-face metallization 8 and the upper face 24 of the source contact connections 27.

The gate contact pad 12 is electrically connected to the gate contact connection 29 via the second layer 41 and via a gold bonding wire, which is not shown. The gold bonding wire has a diameter of 25 μm. Once the bonding-wire connections have been produced, the power semiconductor device 2, the bonding wires 42 and at least the upper face 20 of the chip carrier 15 and the upper face 24 of the contact connections 16 are embedded in a plastic packaging compound 5.

In further embodiments, which are not illustrated in the figures, the power semiconductor component can be a lateral power semiconductor device, in which the front-face metallization provides at least one source contact pad, one gate contact pad and one drain contact pad on the upper face of the power semiconductor component. The front-face metallization may be a metal seed layer, which is electrically connected to the leadframe via a planar interposing structure. The front-face metallization may also be a double layer, with a contact layer being arranged on the metal seed layer.

LIST OF REFERENCE SYMBOLS

1 Power semiconductor device
2 Power semiconductor component
3 Leadframe
4 Plastic housing
5 Plastic housing compound
6 Line
7 Upper face of the semiconductor component
8 Front-face metallization
9 Rear face of the semiconductor component
10 Rear-face metallization
11 Source contact pad
12 Gate contact pad
13 Drain contact pad
14 Metal seed layer
15 Chip carrier
16 Contact connection
17 Edge face of the semiconductor component
18 Through-opening
19 Soft-solder layer
20 Upper face of the chip carrier
21 Planar interposing structure
22 Isolation film
23 Connecting layer
24 Upper face of the contact connection
25 Upper face of the isolation film
26 First area of the connecting layer
27 Source contact connection
28 Second area of the connecting layer
29 Gate contact connection
30 Trenches
31 Lower face of the contact connections
32 Lower face of the plastic housing compound
33 Dashed line
34 Lower face of the isolation film
35 Bridge
36 Second power semiconductor device
37 First layer of the connecting layer
38 Second layer of the connecting layer
40 Third power semiconductor device
41 Second layer of the front-face metallization
42 Bonding wire
43 Upper face of the second layer

What is claimed is:

1. A power semiconductor component comprising a semiconductor body with a front face and a rear face, the front face having a structured metal seed layer as a front-face metallization which provides at least one first contact pad, wherein the structured metal seed layer is arranged directly on the semiconductor body and has a thickness d where 1 nm≦d≦0.5 μm.

2. The power semiconductor component according to claim 1, wherein the thickness of the metal seed layer is 1 nm≦d≦200 nm.

3. The power semiconductor component according to claim 1, wherein the metal seed layer comprises Cr, Ni, Pd or Ti.

4. The power semiconductor component according to claim 1, wherein the metal seed layer is free of aluminum.

5. The power semiconductor component according to claim 1, wherein the power semiconductor component is a vertical power semiconductor component, the front-face metallization furthermore providing at least one control contact pad, and the rear face having at least one second contact pad.

6. The power semiconductor component according to claim 1, wherein the power semiconductor component is a lateral power semiconductor component, with the front-face metallization furthermore providing at least one control contact pad and at least one second contact pad.

7. The power semiconductor component according to claim 1, wherein the control contact pad is provided in the form of a strip.

8. The power semiconductor component according to claim 1, wherein the power semiconductor component is a MOSFET, a BJT or an IGBT.

9. The power semiconductor component according to claim 1, wherein the power semiconductor component is a diode.

10. The power semiconductor component according to claim 1, wherein a contact layer is arranged on the metal seed layer, and comprises one or more electrochemically applied metals.

11. The power semiconductor component according to claim 10, wherein the contact layer consists essentially of copper, nickel or an alloy thereof.

12. The power semiconductor component according to claim 10, wherein the contact layer is free of aluminum.

13. The power semiconductor component according to claim 10, wherein the contact layer has a thickness a, where $10\ \mu m \leq a \leq 500\ \mu m$.

14. A semiconductor wafer having a plurality of component positions, which are arranged in rows and columns and each provide a power semiconductor component according to claim 1.

15. A power semiconductor device having at least one power semiconductor component according to claim 1.

16. A power semiconductor device comprising: a power semiconductor component according to claim 1, a leadframe having a plurality of contact connections and a chip carrier, the contact connections each having an inner contact pad and an outer contact pad, an isolation film with an upper face and a lower face, the rear face of the semiconductor component being mounted on the chip carrier, and the isolation film being arranged on the front face of the semiconductor component and extending from the front face to an upper face of at least one contact connection, and bridging a distance between the chip carrier and the contact connection, and an electrically conductive connecting layer being arranged on the upper face of the isolation film, and electrically connecting a first contact pad and the front-face metallization to at least one contact connection.

17. The power semiconductor device according to claim 16, wherein the isolation film comprises at least one through-opening, which exposes at least one area of the first contact pad.

18. The power semiconductor device according to claim 16, wherein the isolation film comprises at least one through-opening, which exposes at least one area of the inner contact pad of the contact connection.

19. The power semiconductor device according to claim 16, wherein a layer which is produced by means of sputtering or vapor deposition is provided as the connecting layer.

20. The power semiconductor device according to claim 16, wherein a multiple layer is provided as the connecting layer.

21. The power semiconductor device according to claim 20, wherein a lowermost layer of the connecting layer is an adhesion-promoting layer, and an uppermost layer of the connecting layer is a low-resistance layer.

22. The power semiconductor device according to claim 21, wherein the lowermost layer is a layer which is produced by means of sputtering or vapor deposition, and the uppermost layer is an electrochemically applied layer.

23. The power semiconductor device according to claim 16, wherein the connecting layer consists essentially of copper, nickel or an alloy thereof.

24. The power semiconductor device according to claim 20, wherein the lowermost layer and/or the uppermost layer of the connecting layer consists essentially of copper, nickel or an alloy thereof.

25. The power semiconductor device according to claim 16, wherein the connecting layer is free of aluminum.

26. The power semiconductor device according to claim 16, wherein the connecting layer has a thickness b, where $10\ \mu m \leq b \leq 500\ \mu m$ preferably $10\ \mu m \leq b \leq 100\ \mu m$.

27. The power semiconductor device according to claim 16, wherein the connecting layer comprises at least two connecting areas, which are electrically isolated from one another and each electrically connect one contact pad on the front-face metallization to at least one contact connection of the leadframe.

28. The power semiconductor device according to claim 16, wherein at least one control contact pad, which is in the form of a strip, is arranged on the front face of the power semiconductor component and is electrically connected essentially over its entire length, via an area of the connecting layer, to at least one contact connection of the leadframe.

29. The power semiconductor device according to claim 16, wherein the power semiconductor device furthermore has a plastic housing compound, which envelops the semiconductor component as well as the isolation film and the connecting layer.

30. The power semiconductor component of claim 1, wherein the thickness of the metal seed layer is $10\ \mu m \leq d \leq 100\ \mu m$.

31. The power semiconductor component of claim 10, wherein the contact layer has a thickness a, where $10\ \mu m \leq a \leq 500\ \mu m$.

32. The power semiconductor component of claim 1, wherein the structured metal seed layer as the front-face metallization provides a second contact pad separate from the first contact pad.

* * * * *

UNITED STATES PATENT AND TRADEMARK OFFICE
CERTIFICATE OF CORRECTION

PATENT NO. : 7,667,326 B2  Page 1 of 1
APPLICATION NO. : 11/736999
DATED : February 23, 2010
INVENTOR(S) : Josef Hoeglauer It is certified that error appears in the above-identified patent and that said Letters Patent is hereby corrected as shown below:

In the Claims:

In Column 14, Claim 31, Line 51:
 Please replace "500" with --100--.

Signed and Sealed this

Tenth Day of August, 2010

David J. Kappos
*Director of the United States Patent and Trademark Office*